(12) United States Patent
Masuda

(10) Patent No.: US 7,278,903 B2
(45) Date of Patent: Oct. 9, 2007

(54) PROCESSING METHOD FOR WAFER AND PROCESSING APPARATUS THEREFOR

(75) Inventor: Takatoshi Masuda, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 11/641,517

(22) Filed: Dec. 19, 2006

(65) Prior Publication Data

US 2007/0141955 A1    Jun. 21, 2007

(30) Foreign Application Priority Data

Dec. 21, 2005  (JP) .............................. 2005-368694

(51) Int. Cl.
*B24B 1/00* (2006.01)
(52) U.S. Cl. .......................................... 451/11; 451/28
(58) Field of Classification Search ................... 451/11, 451/12, 27, 28, 41, 36, 57
See application file for complete search history.

(56) References Cited

U.S. PATENT DOCUMENTS

2004/0119166 A1*  6/2004  Sunohara .................... 257/758
2004/0235273 A1*  11/2004  Jang ........................... 438/480

FOREIGN PATENT DOCUMENTS

| JP | 2004-281551 | 7/2004 |
| JP | 2005-123425 | 12/2005 |

* cited by examiner

Primary Examiner—Jacob K. Ackun, Jr.
(74) Attorney, Agent, or Firm—Brinks, Hofer, Gilson & Lione

(57) ABSTRACT

A processing method for wafers includes: a preparing step for preparing a wafer having an active device region and a reinforcing rib region. The active device region having plural devices is formed on a surface of the wafer, and the reinforcing rib region is at an outer circumferential edge of the wafer. The processing method further includes: a first grinding step for holding the surface of the wafer on a chuck table of a grinding apparatus and grinding an entire rear surface of the wafer by using a first grinding stone; and a second grinding process for grinding the entire rear surface of the wafer by using a second grinding stone which has an abrasive grain diameter smaller than that of the first grinding stone. The processing method further includes: a first recessed shape forming step for grinding a region of the rear surface which corresponds to the active device region of the surface by relatively moving the second grinding stone and the wafer, so that the reinforcing rib region is formed to be thicker than an inside region of the wafer and the wafer is formed into a recessed shape; and a second recessed shape forming step for grinding the region of the rear surface which corresponds to the active device region of the surface by using a third grinding stone which has an abrasive grain diameter smaller than that of the second grinding stone, so that the reinforcing rib region is formed to be thicker than the inside region of the wafer and the wafer is further formed into a recessed shape.

1 Claim, 4 Drawing Sheets

Fig. 4A
Fig. 4B
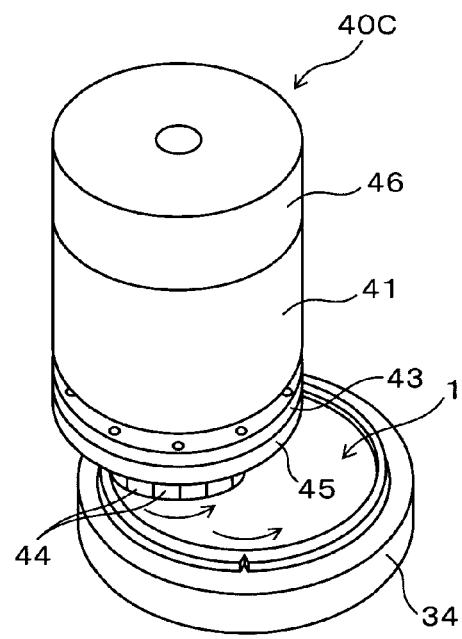
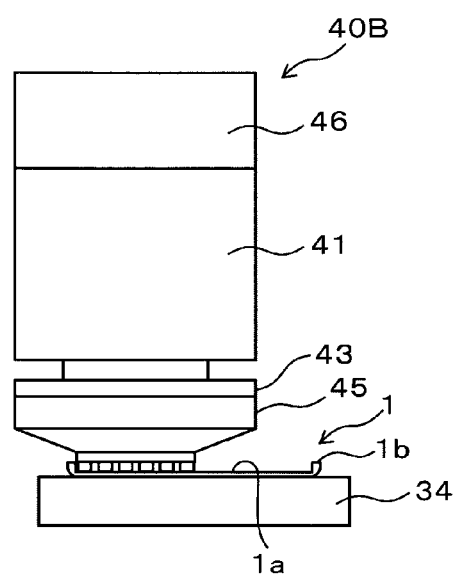
Fig. 4C
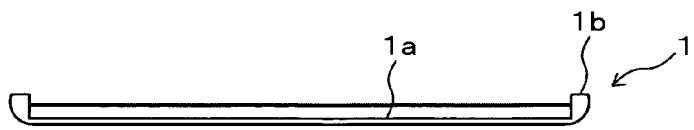

PROCESSING METHOD FOR WAFER AND PROCESSING APPARATUS THEREFOR

This application claims priority under 35 U.S.C. § 119 to Japanese Patent Application Nos. JP2005-368694, filed Dec. 21, 2005, the entire content of which is hereby incorporated by reference.

BACKGROUND OF THE INVENTION

1. Field of the Invention

The present invention relates to a grinding apparatus for reducing a thickness of a semiconductor wafer (hereinafter simply referred to as "wafer"), which is intended to be divided into plural semiconductor chips, by grinding a rear surface of the wafer. In particular, the present invention relates to a technique in which the wafer is subjected to grinding so as to have a thick reinforcing rib at an outer circumferential edge of the wafer.

2. Description of the Related Art

A Wafer having devices (for example, Integrated Circuits (=ICs) and Large Scale Integrations (=LSIs)) formed on a surface thereof is required to be made as thin as possible in order to improve it in lightness, thinness, and compactness. Therefore, in conventional techniques, the wafer has been thinned by grinding a rear surface thereof. A metal film may be formed on the rear surface of the thinned wafer by vacuum deposition or the like. However, since the wafer has a thickness of about 50 µm which is very thin, the wafer easily breaks in handling it. Thus, as disclosed in Japanese Unexamined Patent Application Publication No. 2004-281551 (in particular, in Abstract) and Japanese Unexamined Patent Application Publication No. 2005-123425 (in particular, in Abstract), a technique has been proposed in which strength is provided to the wafer by forming a thick rib on an outer circumferential edge of the wafer in grinding it for thinning the wafer. The wafer having the thick rib on the outer circumferential edge is simply referred to as "a drum-shaped wafer".

In order to prevent breakage of active device region of the drum-shaped wafer and chips which are obtained by dividing the wafer, a technique for prevention of damage to the wafer due to processing is necessary. Therefore, when a rear surface of the wafer corresponding to an active device region formed on a surface thereof is ground, it is necessary to use a grinding stone having a grinding grain diameter which is as small as possible. However, when a wafer is ground from an initial thickness thereof by a grinding stone having fine abrasive grains, grinding is time-consuming, so that productivity is deteriorated. In addition, the grinding stone wears quickly, so that consumable tool cost increases.

SUMMARY OF THE INVENTION

An object of the present invention is to provide a processing method and a processing apparatus for wafers, which can improve productivity and reduce consumable tool cost by increasing a processing speed in grinding a drum-shaped wafer.

According to one aspect of the present invention, a processing method for wafers includes: a preparing step for preparing a wafer having an active device region and a reinforcing rib region. The active device region having plural devices is formed on a surface of the wafer, and the reinforcing rib region is at an outer circumferential edge of the wafer. The processing method further includes: a first grinding step for holding the surface of the wafer on a chuck table of a grinding apparatus and grinding an entire rear surface of the wafer by using a first grinding stone; and a second grinding process for grinding the entire rear surface of the wafer by using a second grinding stone which has an abrasive grain diameter smaller than that of the first grinding stone. The processing method further includes: a first recessed shape forming step for grinding a region of the rear surface which corresponds to the active device region of the surface by relatively moving the second grinding stone and the wafer, so that the reinforcing rib region is formed to be thicker than an inside region of the wafer and the wafer is formed into a recessed shape; and a second recessed shape forming step for grinding the region of the rear surface which corresponds to the active device region of the surface by using a third grinding stone which has an abrasive grain diameter smaller than that of the second grinding stone, so that the reinforcing rib region is formed to be thicker than the inside region of the wafer and the wafer is further formed into a recessed shape.

According to another aspect of the present invention, a processing apparatus for wafers includes: a chuck table which holds a surface of a wafer having an active device region and a reinforcing rib region, the active device region having plural devices formed on the surface of the wafer, the reinforcing rib region at an outer circumferential edge of the wafer. The processing apparatus further includes: a first grinding device which has a first grinding stone and grinds an entire rear surface of the wafer which is chucked on the chuck table; and a second grinding device which has a second grinding stone having an abrasive grain diameter smaller than that of the first grinding stone and grinds the entire rear surface of the wafer. The processing apparatus further includes: a moving device which moves the second grinding stone to a position of the rear surface which corresponds to the active device region of the surface by relatively moving the second grinding stone and the wafer; and a third grinding device which has a third grinding stone having an abrasive grain diameter smaller than that of the second grinding stone and grinds the region of the rear surface which corresponds to the active device region of the surface.

In the present invention, the rear surface of the wafer is ground so that the wafer has a predetermined thickness. Next, the region of the rear surface which corresponds to the active device region of the surface is ground by relatively moving the second grinding device and the wafer, so that the reinforcing rib region is formed to be thicker than the inside region of the wafer and the wafer is formed into the recessed shape. Therefore, a grinding stone composed of moderately fine abrasive grains is used as the second grinding stone of the second grinding device, so that the processing speed of the first recessed shape forming step can be faster. Next, the region of the rear surface which corresponds to the active device region of the surface is ground by the third grinding device, so that the reinforcing rib region is formed to be thicker than the inside region of the wafer and the wafer is further formed into the recessed shape. Therefore, a grinding stone composed of fine abrasive grains is used as the third grinding stone of the third grinding device, so that damage to the active device region due to processing can be reduced. In addition, by appropriately setting a grain size of the second grinding stone, the reinforcing rib region can be fine finished without decreasing the processing speed of the second grinding device, and damage to the reinforcing rib region due to processing can be reduced.

The grinding stone of the third grinding device may be a grinding stone provided to a cup wheel or a powdered grinding stone included in a polishing buff in buffing. When the powdered grinding stone is used, the third grinding device may be a buffing device. The grinding and the buffing may be wet type or a dry type. The reinforcing rib region may be subjected to finish grinding.

In the present invention, processing from grinding of the entire rear surface of the wafer to finish grinding of region of the rear surface corresponding to the active device region of the surface is performed by the three grinding devices, and optimum processing loads are respectively provided to the three grinding devices, so that the overall processing efficiency can be improved. As a result, in grinding for drum-shaped wafer, the processing speed can be faster, so that the productivity can be improved and the consumable tool cost can be reduced.

BRIEF DESCRIPTION OF THE DRAWINGS

FIGS. 4A and 4B are a plan view and a side view which show a grinding wheel of a third grinding unit, and FIG. 4C is a side view which shows a processed wafer.

DETAILED DESCRIPTION OF THE INVENTION

1. Construction of Embodiment

Figure 1:
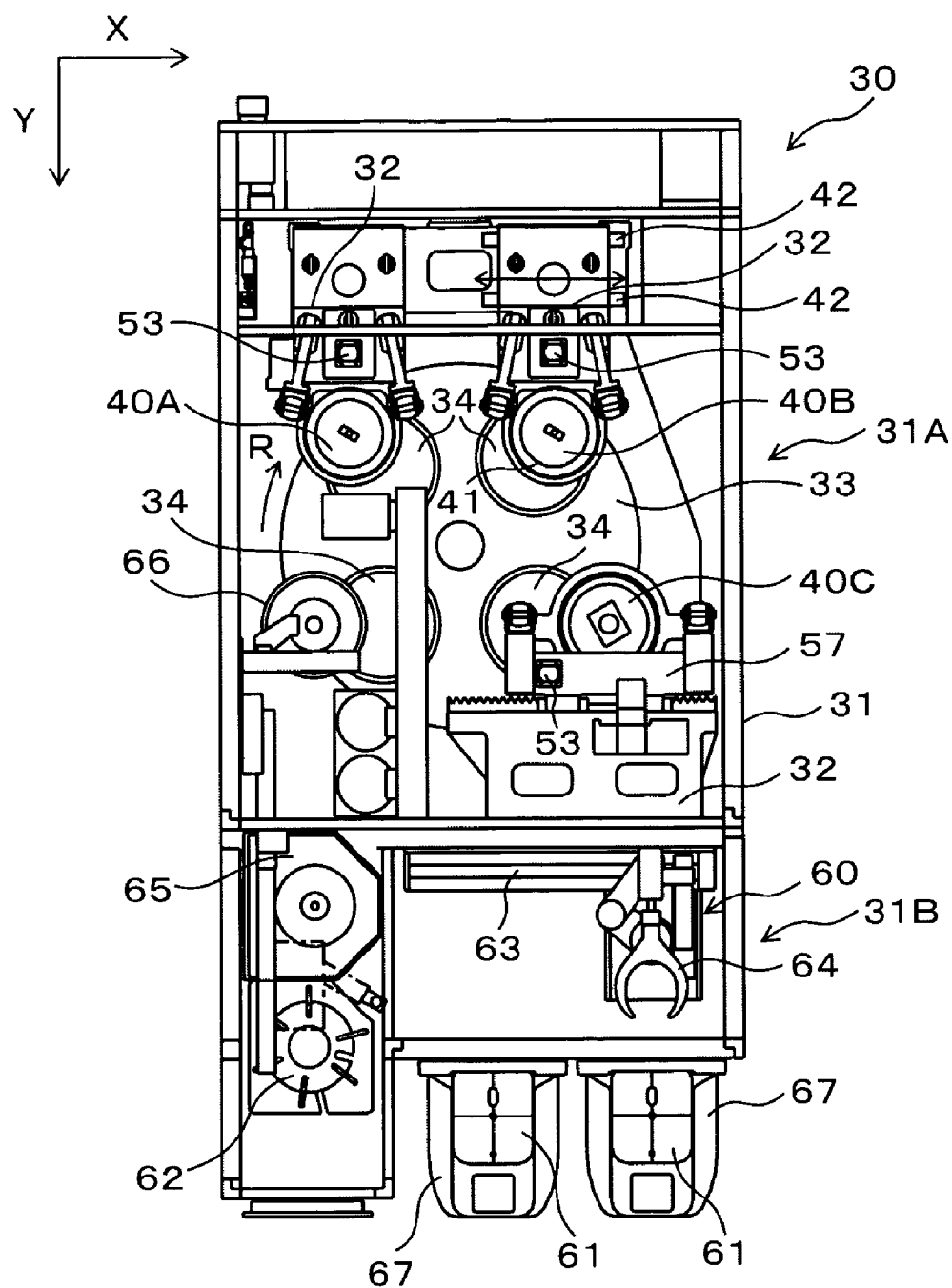
FIG. 1 is a plan view which shows a grinding apparatus of an embodiment according to the present invention.

An embodiment of the present invention will be explained hereinafter with reference to FIGS. 1 to 4C. FIG. 1 is a plan view which shows a grinding apparatus 30 of the embodiment. The grinding apparatus 30 is equipped with a pedestal 31 which has various mechanisms provided thereon. A main portion of the pedestal 31 is a rectangular parallelepiped portion having a flat upper surface. The pedestal 31 has columns 32 at an end portion (which is an upper side end portion in FIG. 1) and a center portion of a longitudinal direction of the pedestal 31 so as to stand perpendicularly to the upper surface of the pedestal 31. In FIG. 1, a Y direction denotes the longitudinal direction and an X direction denotes a width direction of the pedestal 31. A grinding area 31A is an area between the columns 32 in the longitudinal direction on the upper surface of the pedestal 31. A supply and collection area 31B is an area opposite to the grinding area 31A on the upper surface of the pedestal 31. Wafers 1 (shown in FIGS. 2A to 2C and the following Figures) before grinding are supplied from the supply and collection area 31B to the grinding area 31A, and wafers 1 after grinding are cleaned and collected on the supply and collection area 31B.

On the grinding area 31A, a disc-shaped turn table 33 is rotatably provided, and has a flat upper surface and a rotation axis which vertically extends. The turn table 33 is rotated in an arrow direction R (shown in FIG. 1) by a rotation driving mechanism (not shown in FIG. 1). Plural (in the embodiment, four) disc-shaped chuck tables 34 are rotatably provided on an outer circumferential portion of the turn table 33 so as to be spaced equally apart from each other in a circumferential direction. The chuck tables 34 have flat upper surfaces and rotation axes which vertically extend in the same manner as that of the turn table 33.

The chuck tables 34 are typical vacuum chuck types for chucking and holding the wafer 1. Each chuck table 34 has many small chucking holes which communicate between a surface of the chuck table 34 and a rear surface thereof. A vacuum device (not shown in FIG. 1) is disposed on the rear surfaces of the chuck tables 34. The wafer 1 is chucked and held on each chuck table 34 by driving the vacuum device. Each chuck table 34 is rotated in one direction or both directions by a rotation driving mechanism (not shown in FIG. 1) which is provided in the turn table 33.

In a condition that two chuck tables 34 are aligned in the X direction proximately to the columns 32 by rotating the turn table 33 in the arrow direction R, a first grinding unit 40A (first grinding device) and a second grinding unit 40B (second grinding device) are disposed directly above the two chuck tables 34 and are disposed in order seen from the upstream of the rotation direction of the turn table 33. The first grinding unit 40A is used for rough grinding of an entire rear surface of the wafer 1. The second grinding unit 40B is used for semi finish grinding of the entire rear surface of the wafer 1 and for grinding of a region of the rear surface of the wafer 1, which corresponds to an active device region of the surface thereof, without grinding a reinforcing rib region, so that the wafer 1 is formed into a recessed shape. The all grinding processes by the second grinding unit 40B are generically referred to as "semi finish grinding". A third grinding unit 40C (third grinding device) is disposed next to the second grinding unit 40B. The third grinding unit 40C is used for finish grinding of the region of the rear surface of the wafer 1, which corresponds to the active device region of the surface thereof, without grinding the reinforcing rib region, so that the wafer 1 is further formed into a recessed shape.

The chuck tables 34 are respectively positioned at four positions, that is, a rough grinding position, a semi finish grinding position, a finish grinding position, and a supply and collection position by a intermittent rotation of the turn table 33. The rough grinding position is under the first grinding unit 40A. The semi finish grinding position is under the second grinding unit 40B. The finish grinding position is under the third grinding unit 40C. The supply and collection position is proximate to the finish grinding position.

As shown in FIG. 1, the first and second grinding units 40A and 40B are elevatably installed to the columns 32 of the pedestal 31, and are moved vertically by an elevation driving mechanism 53 which has a ball screw, a ball nut, and a motor, etc. Each grinding unit 40A, 40B and 40C is constructed such that a grinding wheel 45, which holds plural chip-like grinding stones 44, is installed to a rotation shaft of a cylindrical spindle 41 via a wheel mount 43. In Figures, a reference numeral 46 denotes a motor which rotates the rotation shaft of the spindle 41.

The grinding stones 44 are adhered to the lower surface of the wheel mount 43 and are composed of diamond abrasive grains. The grinding stones 44 of the first grinding unit 40A are grinding stones for rough grinding and have abrasive grain diameters of, for example, about 20 to 60 μm. The grinding stones 44 of the second grinding unit 40B have abrasive grain diameters of, for example, about 3 to 6 μm. The grinding stones 44 of the third grinding unit 40C are grinding stones for finish grinding and have abrasive grain diameters of, for example, about more than 0 μm and not more than 3 μm.

The position of the grinding unit 40A in the X and Y directions is set such that outer edges of rotation loci of the grinding stones 44 pass directly above the center of the chuck table 34 positioned at the rough grinding position. In this position relationship between the grinding stones 44 and the chuck table 34, while the chuck table 34 and the wafer held thereon are rotated, the wafer is pressed by the grinding stones 44 of the grinding wheel 45, the entire rear surface of the wafer is ground. In grinding of the wafer, grinding lubricant is sprayed from a grinding lubricant spray nozzle (not shown in Figures) onto the wafer and the grinding wheel 45.

The grinding unit 40B approximately has the same construction as the grinding unit 40A and is different from the grinding unit 40A in that the column 32 is supported by a guide rail 42 so as to be movable in the X direction by a driving mechanism (not shown in Figures). The grinding unit 40C is supported by a slide unit 57 which is movable with respect to the column 32 in the X direction so as to be movable in the X direction. The grinding unit 40C is vertically elavatable with respect to the slide unit 57. A moving mechanism for moving the grinding unit 40C in the X direction may be constructed in the same manner as that of the grinding unit 40B such that the column 32 is supported by the guide rail 42. A moving mechanism for moving the grinding unit 40B in the X direction may use the slide unit 57 in the same manner as that of the grinding unit 40C.

Each grinding stone 44 of the grinding units 40B and 40C has a rotation diameter (which is hereinafter referred to as "grinding stone diameter") which is approximately half of the diameter of the wafer 1 so as to grind a region of the rear surface, which corresponds to the active device region of the wafer 1, without an unground portion remaining thereon. When the third grinding unit 40C uses buffing, the buffing diameter may be equal to an inner diameter of the reinforcing rib 1b or smaller. The grinding stones 44 of the grinding unit 40A have grinding stone diameters which are equal to the radius of the wafer 1 or larger.

Next, the supply and collection area 31B will be explained. A triple-jointed link type moving robot 60 is disposed on the right side of the supply and collection area 31B. The moving robot 60 is movable along a guide rail 63 in the X direction. A robot hand 64 of the moving robot 60 is vertically movable by a driving mechanism (not shown in FIG. 1). A spinner type cleaning device 65, a positioning pedestal 62, and supply and collection cassettes 61 and 61 are respectively disposed around the moving robot 60 in a counterclockwise direction seen from above. In FIG. 1, a reference numeral 67 denotes a pedestal for setting the supply and collection cassette 61.

The moving robot 60 draws a wafer 1 from the supply and collection cassette 61 and mounts the wafer 1 on the positioning pedestal 62. The moving robot 60 inserts a wafer 1, which is provided in the cleaning device 65, into the supply and collection cassette 61. A moving pad 66 is disposed above the positioning pedestal 62 and the cleaning device 65 so as to be movable in the X and Y directions and the vertical direction. The moving pad 66 mounts the wafer 1, which is disposed on the positioning pedestal 62, to the chuck table 34 which is disposed at the supply and collection position. The moving pad 66 inserts the wafer 1, which is disposed on the chuck table 34, to the cleaning device 65.

2. Operation of Embodiment

A protective tape is applied to a surface of a wafer 1 on which semiconductor devices are formed. The protective tape has a base film and an adhesive coated on a surface of the base film. The base film is composed of soft material (for example, polyolefin) and has a thickness of about 70 to 200 µm. The adhesive has a thickness of about 5 to 20 µm. The surface of the protective tape on which the adhesive is coated faces the surface of the wafer 1 and is applied thereto. The protective tape may be heat-resistant in accordance with post processes. The wafer 1 having the protective tape applied to the surface thereof is provided into the supply and collection cassette 61 and is mounted to the pedestal 67 of the grinding apparatus 30. Next, the moving robot 60 moves directly under the wafer 1 provided in the supply and collection cassette 61, and chucks and draws the wafer 1 from the supply and collection cassette 61 by vacuum chucking. After one wafer 1 is drawn from the supply and collection cassette 61 by the moving robot 60, the wafer 1 is reversed and mounted onto the positioning pedestal 62 such that a rear surface of the wafer 1 faces upward. In this case, the wafer 1 is positioned at a predetermined position on the positioning pedestal 62. Next, by the moving pad 66, the wafer 1 is chucked and held, is moved from the positioning pedestal 62 to the chuck table 34, and is mounted thereon. In this case, the chuck table 34 waits at the supply and collection position.

Figure 2A:
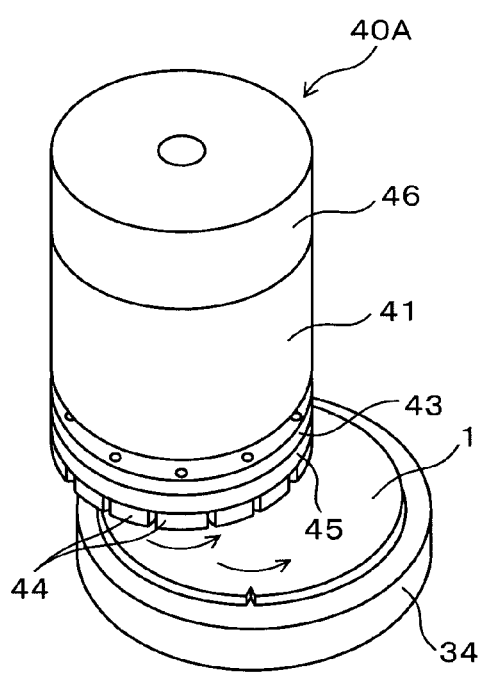
FIGS. 2A and 2B are a plan view and a side view which show a grinding wheel of a first grinding unit.
Figure 2B:
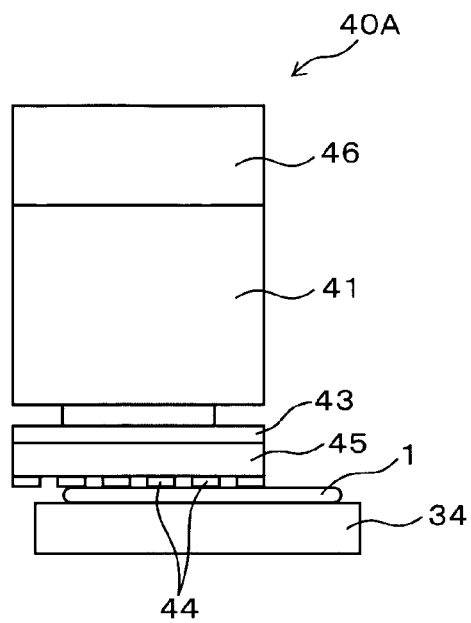
Figure 2C:
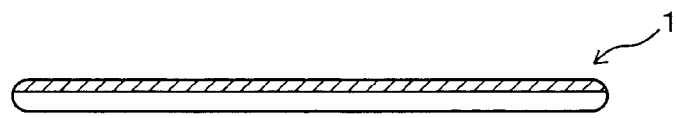
FIG. 2C is a side view which shows a processed wafer.

When the wafer 1 is mounted onto the chuck table 34, the wafer 1 is simultaneously chucked on the chuck table 34 by driving the vacuum device. In this condition of the wafer 1, the turn table 33 rotates in the arrow direction R shown in FIG. 1, and the chuck table 34 holding the wafer 1 stops at the rough grinding position. In this case, a next chuck table 34 is positioned at the supply and collection position, and one wafer 1, which is intended to be subjected to grinding next, is set onto the next chuck table 34 in the same manner described above. Next, the chuck table 34 positioned at the rough grinding position is rotated and the wafer 1 held thereon is rotated. On the other hand, while the grinding wheel 45 of the grinding unit 40A for rough grinding is rotated, the grinding wheel 45 is slowly moved downward at a predetermined speed, presses the grinding stones 44 on the rear surface of the wafer 1, and performs rough grinding on the rear surface of the wafer 1. In this rough grinding, a portion which is shown by using a hatched line in FIG. 2C is ground.

Figure 3A:
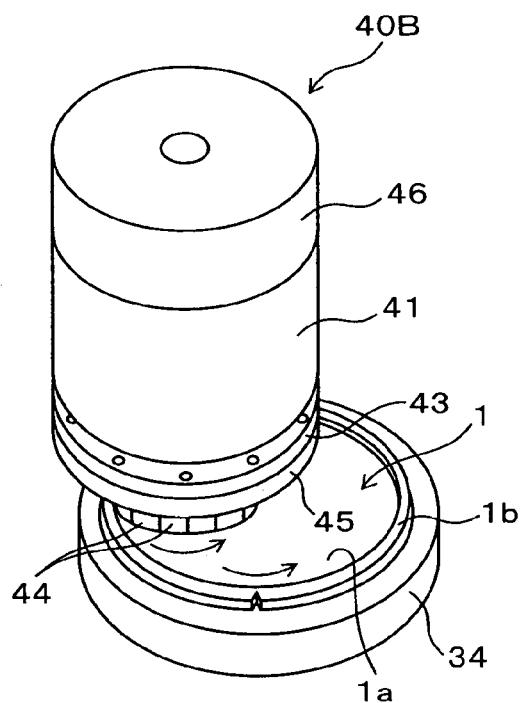
FIGS. 3A and 3B are a plan view and a side view which show a grinding wheel of a second grinding unit.
Figure 3B:
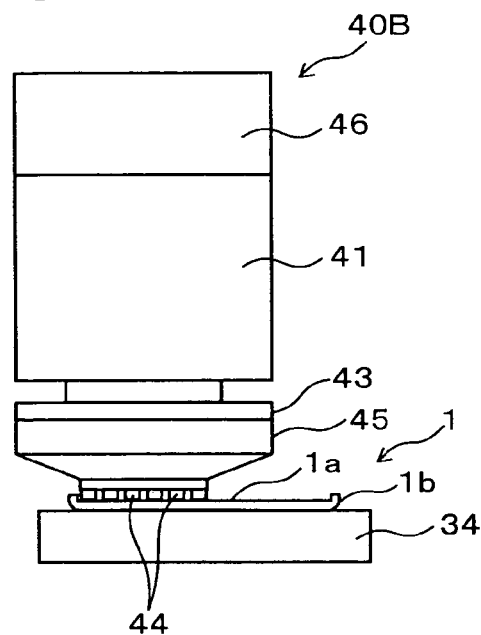
Figure 3C:
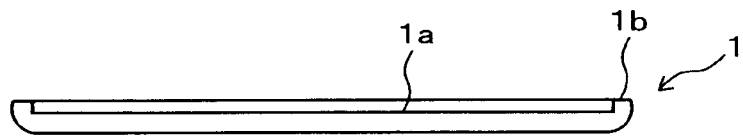
FIG. 3C is a side view which shows a processed wafer.
Figure 3D:
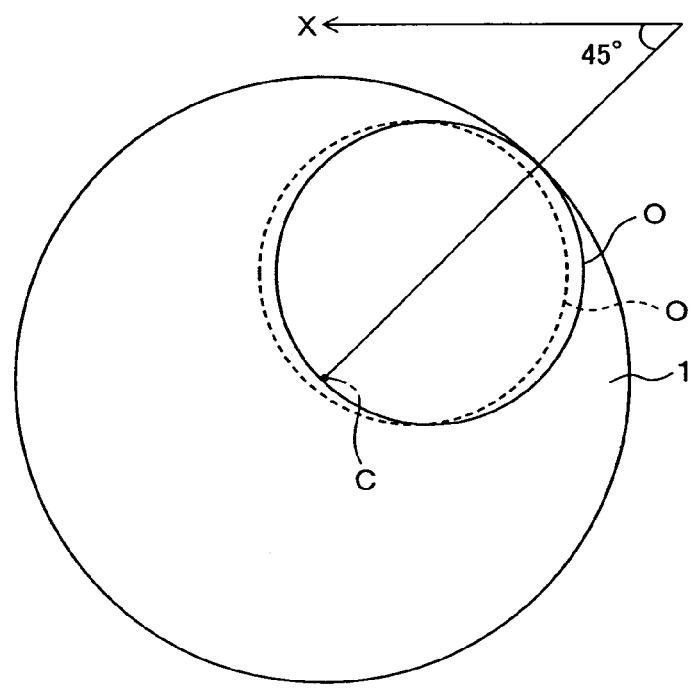
FIG. 3D is a plan view which shows a position of a grinding stone diameter with respect to a wafer.

Next, the wafer 1 which was subjected to the rough grinding is moved to the semi finish grinding position by rotating the turn table 33 in the arrow direction R. At the semi finish grinding position, the chuck table 34 is rotated and the second grinding unit 40B for semi finish grinding is used, so that the rear surface of the wafer 1 is further ground. FIG. 3D shows a grinding stone diameter 0 of the second grinding unit 40B. For example, when the wafer 1 has a diameter of 200 mm, the grinding stone diameter 0 is 100 mm. As shown in FIG. 3D, the grinding stone diameter 0 denoted by a solid line passes a center C and an outer circumferential edge of the wafer 1. In this condition of the wafer 1, the entire rear surface of the wafer 1 is ground by the grinding unit 40B. When the wafer 1 is ground to have a predetermined thickness, downward movement of the grinding unit 40B is stopped. Next, the grinding unit 40B is moved in the X direction, and is positioned at a position of the grinding stone diameter 0 denoted by a dotted line shown in FIG. 3D. In this case, when the grinding stone diameter 0 shifts from the initial position by only a size which is smaller than the width of the grinding stone 44, an unground area does not remain on a region 1a of the rear surface of the wafer 1 which corresponds to an active device region having the semiconductor devices formed on the surface thereof.

Next, the grinding unit 40B is moved downward, and the region 1a of the rear surface of the wafer 1 is ground. As a result, the wafer 1 is processed to have a recessed shape, and a reinforcing rib 1b, which is thicker than the inside region, is formed on an outer circumferential edge portion of the wafer 1.

In cooperation with the above actions, the wafer 1 which was set at the supply and collection position beforehand is moved to the rough grinding position and is subjected to rough grinding in the same manner described above in parallel with the semi finish grinding of the preceding wafer 1. In addition, one wafer 1 which is intended to be subjected to grinding next is set onto the chuck table 34 which was moved to the supply and collection position.

Next, the wafer 1 which was subjected to the semi finish grinding is moved to the finish grinding position by rotating the turn table 33 in the arrow direction R. A grinding stone diameter of the third grinding unit 40C is half of the diameter of the wafer 1 and is positioned at the position denoted by the dotted line shown in FIG. 3D. Next, at the finish grinding position, the chuck table 34 is rotated in the same manner described above and the third grinding unit 40C for finish grinding is used, so that the region 1a on the rear surface of the wafer 1, which corresponds to the active device region of the surface, is ground. In the embodiment, the finish grinding is wet type grinding. The finish grinding of the embodiment is not limited to the wet type grinding and may be dry type grinding. Instead of using the grinding stones 44, buffing may be performed.

When the rough grinding, the semi finish grinding and the finish grinding performed in parallel with each other are completed, the turn table 33 is rotated, so that the wafer 1 which was subjected to the finish grinding is moved to the supply and collection position. Thus, the following wafers 1 are respectively moved to the rough grinding position, the semi finish grinding position and the finish grinding position. The wafer 1 on the chuck table 34 positioned at the supply and collection position is moved to the cleaning device 65 by the moving pad 66, and is subjected to water cleaning and drying by the cleaning device 65. The wafer 1 cleaned by the cleaning device 65 is moved to the supply and collection cassette 61 and is provided there into by the moving robot 60.

In the embodiment, since the semi finish grinding, which includes the grinding of the entire rear surface of the wafer 1 and the grinding of the region 1a of the rear surface corresponding to the active device region of the surface, is performed by the second grinding unit 40B, the region 1a of the rear surface corresponding to the active device region of the surface can be processed at a high speed so as to be very thin. For example, the optimum grind amount of the wafer 1 in the embodiment is obtained from the difference between grinding speeds of the second and the third grinding units 40B and 40C, the grinding speeds depending on grain sizes of the grinding stones 44 of the second and the third grinding units 40B and 40C. That is, processing time periods of the second grinding unit 40B, which can be processed at a speed of 0.5 μm/sec, and the third grinding unit 40C, which can be processed at a speed of 0.7 μm/sec are set to be balanced, so that tact time (interval time period of processing completion) for sequently processing of the plural wafers 1 can be short.

In conventional techniques, after finish grinding of an entire rear surface of one wafer 1 is completed by the grinding unit 40B, processing of the region 1a (forming of recessed portion) of the rear surface, which corresponds to the active device region of the surface, is performed by only the third grinding unit 40C. Due to this, the processing time period of the third grinding unit 40C is about 530 seconds and causes a bottleneck, thereby determining the tact time. In order to solve this problem of the conventional techniques, in the embodiment of the present invention, forming of the region 1a of the rear surface, which corresponds to the active device region of the surface, is performed by the second and the third grinding units 40B and 40C, and total time period for processing of the entire rear surface and the region 1a of the rear surface by the second grinding unit 40B is set to be approximately equal to the time period for processing of the region 1a of the rear surface by the third grinding unit 40C. Therefore, the tact time can be short. Since the second grinding unit 40B is movable in the X direction, the above processing by the grinding unit 40B can be performed. Thus, in the embodiment, the processing from the grinding of the entire rear surface of the wafer 1 to the finish grinding of the region 1a of the rear surface is performed by the grinding units 40A, 40B and 40C, and optimum processing loads are respectively provided to the grinding units 40A, 40B and 40C, so that the overall processing efficiency can be improved. As a result, in grinding for drum-shaped wafer, the processing speed is increased, so that the productivity can be improved and the consumable tool cost can be reduced.

What is claimed is:

1. A processing method for wafers, comprising:
    a preparing step for preparing a wafer having an active device region and a reinforcing rib region, the active device region having plural devices formed on a surface of the wafer, the reinforcing rib region at an outer circumferential edge of the wafer;
    a first grinding step for holding the surface of the wafer on a chuck table of a grinding apparatus and grinding an entire rear surface of the wafer by using a first grinding stone;
    a second grinding process for grinding the entire rear surface of the wafer by using a second grinding stone which has an abrasive grain diameter smaller than that of the first grinding stone;
    a first recessed shape forming step for grinding a region of the rear surface which corresponds to the active device region of the surface by relatively moving the second grinding stone and the wafer, so that the reinforcing rib region is formed to be thicker than an inside region of the wafer and the wafer is formed into a recessed shape; and
    a second recessed shape forming step for grinding the region of the rear surface which corresponds to the active device region of the surface by using a third grinding stone which has an abrasive grain diameter smaller than that of the second grinding stone, so that the reinforcing rib region is formed to be thicker than the inside region of the wafer and the wafer is further formed into a recessed shape.

* * * * *